July 28, 1959 F. L. HOWLAND ET AL 2,897,419

SEMICONDUCTOR DIODE

Filed March 1, 1957

INVENTORS F. L. HOWLAND
J. W. WEST

BY H.W. Lockhart

ATTORNEY

United States Patent Office
2,897,419
Patented July 28, 1959

2,897,419

SEMICONDUCTOR DIODE

Frank L. Howland, Morristown, and John W. West, Millington, N.J., assignors to Bell Telephone Laboratories, Incorporated, New York, N.Y., a corporation of Delaware Application March 1, 1957, Serial No. 643,209

5 Claims. (Cl. 317—234)

This invention relates to semiconductor devices and more particularly to a hermetically sealed housing structure for a semiconductor device.

This invention, in one aspect, is directed to the problem of mounting, enclosing, and making connection to semiconductive devices, particularly those of the type generally referred to as junction devices. Junction-type semiconductor devices are well-known in the art and are fabricated for a variety of uses in a number of ways, likewise, generally well-known and broadly referred to as grown, diffused, and alloyed junctions. Many of the general uses of junction-type semiconductors are disclosed in the Patent 2,569,347, granted to W. Shockley on September 25, 1951.

In one specific aspect, this invention relates to a structure and a method for housing a two-terminal junction-type semiconductor device useful in communication switching systems such, for example, as that disclosed in the application of I. M. Ross, Serial No. 521,757, filed July 13, 1955, now Patent 2,862,115, issued November 25, 1958. It is desirable with devices of the type disclosed in the above-noted application of Ross to mount the semiconductive element in a hermetically sealed envelope which is of extremely small dimensions and in which electrical connection may be made facilely to the semiconductive body. It is also desirable to provide a housing structure which readily lends itself to the use of automatic or semiautomatic assembly means in order to reduce the cost of such units.

Therefore, one object of this invention is an improved housing arrangement for a semiconductor junction device.

More specifically, an object of this invention is a semiconductor housing of extremely small dimensions. Coupled with small size, a further object is a structure of low cost which may be achieved through automatic or semiautomatic assembly methods.

Another object of this invention is a fabrication method whereby low resistance contacts to the semiconductive body and the final assembly operations of the housing are accomplished at temperatures sufficiently low to insure that the junction structure of the semiconductive body will not be deleteriously affected.

In one specific aspect, this invention combines the advantageous bonding techniques disclosed in the application of O. L. Anderson-H. C. Christensen, Serial No. 619,639, filed October 31, 1956, with a novel arrangement of elements to produce the advantageous housing assembly described herein. Specifically, a ceramic ring member is bonded between a metallic base member and a cover member in a unitary assembly in which the cover member itself, from the standpoint of composition and shape, is designed to enable simultaneous sealing of the housing and bonding of contacts to the semiconductive body.

One feature of the semiconductor device in accordance with this invention is the configuration of the metal base member which enables facile automatic location of the semiconductive wafer thereupon.

A further feature resides in the novel shape of the cover member comprising a protuberant central portion for bearing against the semiconductive wafer and a diaphragmatic resilient portion for transferring the pressure applied to the periphery of the cover member to the protuberant central portion.

A further feature of the device in accordance with this invention is the anti-symmetric arrangement which enables its ready use in systems employing printed circuit boards.

The invention and its other objects and features will be more fully understood from a consideration of the following description taken in connection with the drawing in which.

Figure 1:
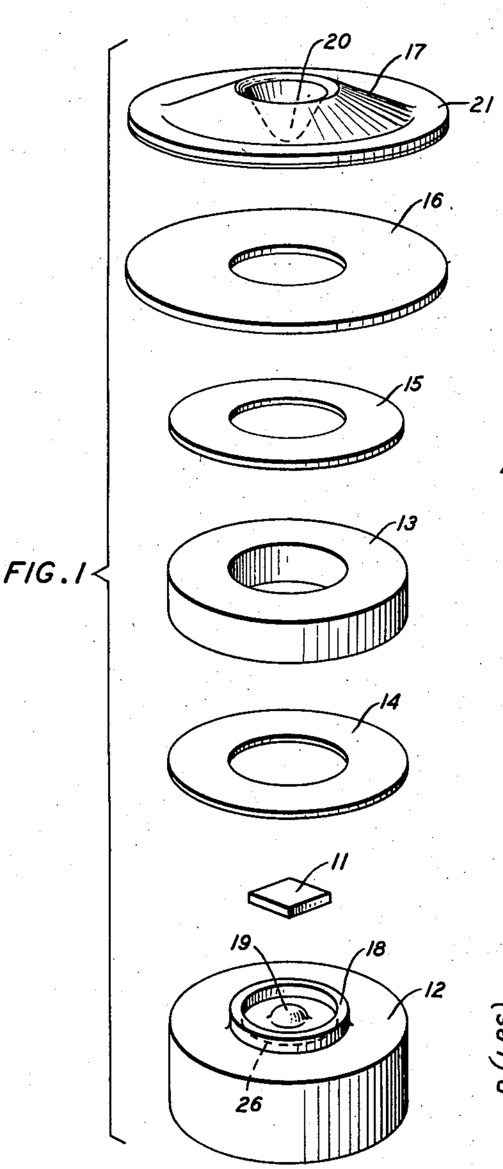
Fig. 1 is an exploded perspective view of one specific embodiment in accordance with this invention.

Referring to Fig. 1, a semiconductive body 11 is provided in the form of a wafer containing one or more p–n junctions which may be produced as disclosed in the above-identified patent of Ross. In one specific application, the wafer 11 may be of single crystal silicon and be 20 mils square in area with a thickness of 4 mils. The lower terminal member comprises a metal base element 12 which, for example, may be of nickel. The base member has a central pedestal 26 having a raised margin 18 and a central rounded protuberance 19.

An insulating washer member 13 is brazed to the base member by means of a brazing washer 14. The insulating member 13 surrounds the pedestal 26 and forms a cavity with the base member 12. This insulating member 13 is advantageously of a ceramic, such as steatite or alumina ($Al_2O_3$). Generally it is important that this insulating member, in order to provide a hermetic barrier, be dense and free of voids. The compressional strength of the ceramic member must be sufficient to withstand the pressures used for accomplishing the bonds with which the housing is finally sealed.

Figure 2:
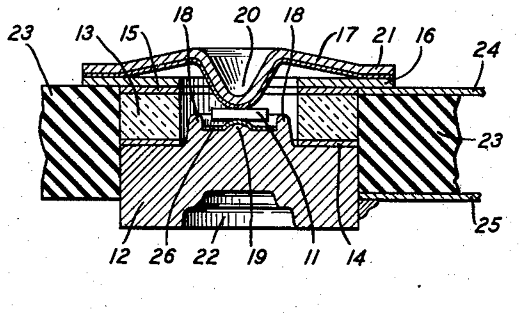
Fig. 2 is a cross section of the device of Fig. 1 assembled in accordance with this invention shown mounted in a portion of a typical printed wiring board.

The brazing-metal washer members 14 and 15 are interposed between the ceramic member 13 and the metal terminal assemblies 12 and 16. Advantageously, these members 14 and 15 are composed of so-called active metals, for example, titanium in combination with brazing materials such as silver-copper eutectic, silver, copper, or nickel. The upper metal washer member 16 is provided as a platform to which the cover member 17 may be bonded. Both the washer 16 and the cover member 17 may be of nickel or like material. The cover member 17 is shown as having a rounded protuberant portion 20 and a peripheral flange 21. As best seen in Fig. 2, the protuberant portion 20 bears against the upper side of the semiconductive wafer and provides sufficient pressure to insure low resistance contact between the semiconductive wafer and both the base member 12 and the cover member 17.

The advantage of this housing arrangement will be evident from a description of the procedure used in assembling the end structure. The base member 12 may be fabricated by a forging and hobbing operation to produce the raised central pedestal 26 with the raised margin 18 and central protuberance 19.

A sub-assembly then is produced comprising the base member 12, the ceramic washer member 13 and the metal washer 16. These members are individually cleaned, mechanically and chemically, and are assembled in the indicated relationship. The metal-to-ceramic seals are formed by heating this sub-assembly to an instantaneous peak temperature of about 980 degrees centigrade followed by rapid cooling in an inert atmosphere, such as argon gas.

The area within the raised margin may be covered with a thin layer of gold to facilitate the contacting operation by a plating step or a bonding operation in accordance with the disclosure of Anderson-Christensen noted heretofore. The semiconductive wafer 11, which has been prepared with the desired internal junction structure and has been mechanically and chemically cleaned by well-known methods, is dropped on the mounting pedestal 26. This may be accomplished by automatic or semiautomatic apparatus. In this specific embodiment in which the wafer 11 is 20 mils on the side, the diameter within the raised margin 18 is 32 mils. Thus, the wafer, which is 28 mils on the diagonal, will position itself within the raised margin and upon the protuberance 19. The wafer 11 may come to rest in a tilted position which, however, will be corrected when the final cover bonding step is carried out.

After the semiconductive wafer 11 has been positioned on the pedestal 26 of the base member 12, the cover member 17 is applied to the assembly. Prior to final assembly, the cover member may have a gold layer applied by plating or bonding to the inner face in similar fashion to the treatment of the mounting surface of the pedestal 26. It is necessary that the final fabrication step be accomplished at a temperature not in excess of about 330 degrees centigrade in order that diffusion of gold within the semiconductive wafer will not occur which might otherwise degrade the internal structure and the performance of the device. It is desirable also that good, low resistance, ohmic contacts be provided to the opposite faces of the semiconductive body. These requirements are met by bonding the cover member 17 to the metal washer member 16 using a pressure of about 30,000 pounds per square inch at a temperature between 310–325 degrees centigrade for a short period of time, typically thirty seconds to five minutes. Under these conditions and using the materials disclosed, a pressure of about 10,000 pounds per square inch is exerted by the protuberant portion 20 upon the semiconductive body 11. This pressure and low heat results in thermocompression bonding of the semiconductive body both to the protuberant portion 19 and the base member 12 and the protuberant portion 20 and the cover member 17.

Although in this specific embodiment, the final hermetic sealing operation is accomplished by the thermocompression bonding technique, other techniques for joining these members may be employed such as electric-resistance welding or cold welding. It is possible also by using certain of these methods to provide a final assembly in which the terminal members are not actually bonded to the wafer but in which low resistance ohmic contact is achieved by the pressure of the supporting members.

It is important in selecting material for the cover member 17 and in designing the configuration thereof to provide for plastic rather than elastic deformation of this member 17. In order to insure a substantially constant contact pressure for the total range of device dimension tolerances, it is desirable to employ a material in which the elastic limit is exceeded when the cover 17 is deformed and joined to the washer member 16. This characteristic may be more readily understood from a consideration of Figs. 3A and 3B.

Figure 3A:
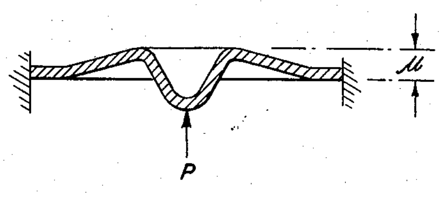
Fig. 3A is a diagrammatic representation of the mechanical loading of the cover member of the embodiment of Figs. 1 and 2.
Figure 3B:
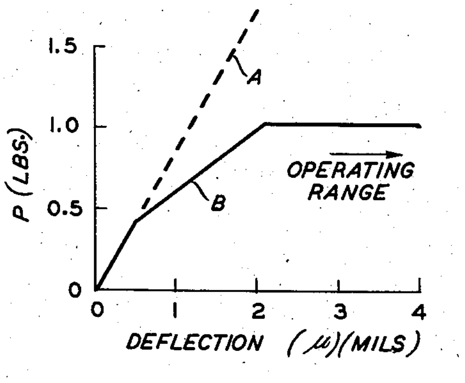
Fig. 3B is a graph depicting the relation between load and deflection of the cover member.

Fig. 3A is a modified force diagram of the cover member. Fig. 3B shows the relation between the load (P) and the deflection ($u$) for a cover member in either plastic or elastic deformation. The dotted curve A shows the characteristic for a material in elastic deformation. It will be apparent that for increasing deflection as represented by larger device dimension tolerances, the load P, which is the force applied to wafer 11, will be changed in direct proportion. The full line curve B illustrates, however, the characteristic for nickel and similar ductile materials. As is brought out by the horizontal portion of this characteristic curve, for a range of device dimensions indicated by the region designated as the operating range, the load remains substantially constant. Specifically, it can be appreciated readily that the stacked arrangement of the parts of the housing assembly, which is most advantageous from the standpoint of automatic assembly methods, may result, however, in considerable final dimensional variations. That is, variations in dimensions occur in the separate elements, namely, the base, insulating and cover members as well as in the brazed joints. Consequently, from one sub-assembly to another, there may be a variation in the dimension between the upper surface of the metal washer member 16 and the upper surface of the semiconductive wafer 11. Furthermore, individual cover members may vary in thickness. Despite these dimensional tolerances in the overall assembly, the pressure applied to the semiconductive wafer after the final bonding operation is substantially the same from device to device as a result of the composition and configuration of the cover member 17.

Typically, a device, in accordance with the structure shown in Fig. 2, may have an overall dimension across the cover plate of 0.2 inch and across the base member of 0.14 inch. The overall thickness of the assembly may be 0.077 inch. Under certain conditions, these dimensions may even be reduced as a consequence of using the structure of this invention. It will be appreciated from a consideration of the foregoing exemplary values that automatic or semiautomatic assembly methods, for which this structure is especially adapted, are essential to the production of a device at a low cost.

This device, which is of anti-symmetric arrangement, lends itself readily to installation in circuit mounting arrangements, such as printed wiring boards. As shown in Fig. 2, the diode is shown in place in a matching hole in a portion of a printed wiring board 23. Connections may be readily made to the device by printed wiring strips 24 and 25.

It is to be understood that the above-described embodiment is only illustrative of a specific application of the principles of the invention. Other arrangements may be described by those skilled in the art without departing from the scope and spirit of the invention.

What is claimed is:

1. A semiconductor device assembly comprising a metal base member, a ceramic washer member mounted on said base member and defining a cavity therewith, a metal washer member mounted on said ceramic member and a metal cover member bonded to said metal washer member, said base member having a central pedestal including a raised circular margin therearound and a central protuberance thereon, a semiconductive body having at least one p-n junction therein mounted on said pedestal and engaging said protuberance, said cover member comprising a resilient diaphragm having a protuberant central portion for contacting said semiconductive body with a pressure independent of the deformation of said cover member when said cover member is bonded to said washer member.

2. A semiconductor device assembly comprising a metal base member, a ceramic washer member mounted on said base member and defining a cavity therewith, a metal washer member mounted on said ceramic member, and a metal cover member metallically bonded to said metal washer member, said base member having a central pedestal including a raised circular margin thereabound and a central protuberance thereon, a semiconductive body having at least one p-n junction therein mounted on said pedestal and bonded to said protuberance, said cover member comprising a resilient dish-shaped diaphragm having a protuberant central portion for contacting said semiconductive body with a pressure independent of the deformation of said cover member when said cover member is metallically bonded to said washer member.

3. An hermetically sealed semiconductor device assembly comprising a metal base member, a ceramic washer member hermetically sealed to said base member and defining a cavity therewith, a metal washer member hermetically sealed to said ceramic washer member, and a metal cover member hermetically bonded to said metal washer member, said base member having a central pedestal including a raised circular margin therearound and a central protuberance thereon, an asymmetrically-conducting semiconductive body having at least one p-n junction therein mounted on said pedestal and bonded to said protuberance, said cover member comprising a resilient dish-shaped diaphragm having a protuberant central portion extending from the concave face of said diaphragm for contacting said semiconductive body with a pressure independent of the deformation of said cover member when said cover member is bonded to said washer member.

4. A method of fabricating a semiconductor device assembly including a semiconductive body having at least one p-n junction therein which includes the steps of providing a metal terminal cover plate member having a protuberant portion therein, mounting said cover member on said assembly so that said protuberant portion engages said semiconductive body mounted in said assembly and applying a pressure and heat to the outer periphery of said cover member to bond said member to said assembly and simultaneously to bond said protuberant portion to said semiconductive body.

5. The method of fabricating a semiconductor device assembly including a semiconductive body having at least one p-n junction therein which includes the steps of providing a metal base member having said semiconductive body mounted therein, mounting a ceramic washer member on said base member and a metal washer member on said ceramic member, simultaneously brazing said ceramic member to said base member and said metal washer member to said ceramic member, applying a metal cover member to said metal washer member and to said semiconductive body, and applying pressure and heat to said cover member to seal said cover member to said washer member and simultaneously to bond said cover and base members to said semiconductive body.

References Cited in the file of this patent

UNITED STATES PATENTS

| | | |
|---|---|---|
| 2,745,044 | Lingel | May 8, 1956 |
| 2,751,528 | Burton | June 19, 1956 |
| 2,756,374 | Colleron et al. | July 24, 1956 |